Dec. 10, 1957 L. C. THOMSON, JR 2,815,608

SEMICONDUCTOR ENVELOPE SEALING DEVICE AND METHOD

Filed Jan. 3, 1955 3 Sheets-Sheet 1

LOUIS C. THOMSON, JR.
INVENTOR.

BY Henry Heyman

ATTORNEY.

Dec. 10, 1957 L. C. THOMSON, JR 2,815,608

SEMICONDUCTOR ENVELOPE SEALING DEVICE AND METHOD

Filed Jan. 3, 1955 3 Sheets-Sheet 2

LOUIS C. THOMSON, JR.
INVENTOR.

BY Henry Heyman

ATTORNEY.

Dec. 10, 1957 L. C. THOMSON, JR 2,815,608

SEMICONDUCTOR ENVELOPE SEALING DEVICE AND METHOD

Filed Jan. 3, 1955 3 Sheets-Sheet 3

LOUIS C. THOMSON, JR.
INVENTOR.

BY Henry Heyman

ATTORNEY.

United States Patent Office 2,815,608
Patented Dec. 10, 1957

2,815,608

SEMICONDUCTOR ENVELOPE SEALING DEVICE AND METHOD

Louis Charles Thomson, Jr., Los Angeles, Calif., assignor to Hughes Aircraft Company, Culver City, Calif., a corporation of Delaware Application January 3, 1955, Serial No. 479,461

12 Claims. (Cl. 49—1)

This invention relates to a method of, and apparatus for, the production of semiconductor devices and, more particularly, to a method of, and apparatus for, joining a metallic electrode and a semiconductor crystal to provide an encapsulated semiconductor device.

In the manufacture of semiconductor diodes, photocells, and similar semiconductor translating devices which have a metallic electrode electrically connected to a surface of a semiconductor crystal, considerable production difficulty has been experienced in properly positioning the electrode in electrical contact with the surface of the semi-conductor crystal during the final assembly stages of the device. For example, in the manufacture of a glass-sealed semiconductor diode having a resilient metallic electrode, or whisker, electrically connected to a semiconductor crystal, an electrode subassembly and a semiconductor crystal subassembly must be so positioned that the electrode electrically contacts the surface of the semiconductor crystal while the electrode and semiconductor crystal are hermetically sealed within the encapsulating glass envelope and remain in electrical contact after the sealing operation of the glass envelope has been completed.

In a representative semiconductor diode manufacturing process, a metallic electrode is spot welded or otherwise connected to its associated lead wire, to which a glass bead has been affixed proximate the end of the lead wire upon which the whisker electrode is mounted. A semiconductor crystal subassembly is obtained by electrically and mechanically bonding a semiconductor crystal, such as germanium wafer containing a donor or acceptor impurity, to its associated lead wire by methods well known to the art, and sealing an encapsulating body such as a glass tube to the associated lead wire proximate the end of the lead wire upon which the semiconductor wafer is mounted. The tubular glass body has an inside diameter substantially equal to, but greater than, the outside diameter of the glass bead of the whisker subassembly, and is of sufficient length, extending beyond the semiconductor crystal, to enclose the electrode subassembly.

To assemble the semiconductor diode in this representative illustration, it is necessary to position the electrode subassembly within the encapsulating tubular body of the semiconductor crystal subassembly such that the electrode makes electrical point contact at a predetermined pressure with the surface of the semiconductor crystal, and to maintain the subassemblies in this relative position while the glass bead of the electrode subassembly and the glass tubular body of the semiconductor crystal subassembly are fused and coalesced to form a hermetically sealed encapsulating envelope.

In accordance with the state of the art prior to the present invention, the insertion of the electrode into the encapsulating envelope comprises two steps: first, making electrical contact between the electrode and the surface of the semiconductor crystal; and second, advancing the electrode subassembly a predetermined distance in order to maintain positive electrical contact between the electrode and the crystal surface and to provide the necessary contact pressure after the encapsulating envelope is sealed. To achieve this, the semiconductor crystal subassembly is fixed in a stationary jig with a heat conducting chuck surrounding the crystal body while the electrode subassembly is affixed to a mechanically movable jig which advances the electrode subassembly within the encapsulating envelope to a point where electrical contact is indicated by an electric circuit which stops the movement of the movable jig. The jig holding the electrode subassembly is then advanced an additional predetermined distance, such as two mils, and the subassemblies are retained in this position. A source of heat surrounds the glass tubular body as the subassemblies are positioned and, when properly positioned, the source of heat is energized and the glass bead is fused and sealed within the glass tube. The electrode is then welded to the surface of the semiconductor crystal by passing a surge of current through the associated lead wires, and the assembly of the diode is complete.

The above-described method of assembly is disadvantageous in that variable electrical characteristics for the semiconductor device are obtained since the contact and advance of the electrode against the crystal surface is not uniform in each assembly operation and the point contact pressure between the electrode and the semiconductor crystal varies. If, in advancing the electrode to the point of electrical contact with the crystal surface, the point of the electrode encounters an oxide layer or a particle of dust or other foreign matter on the surface of the crystal, the mechanical movement of the jig will continue until electrical contact is indicated by the meter circuit. Thus, in order to achieve electrical contact, the electrode, being a resilient metallic wire, may deflect and encounter the surface of the crystal at an angle to avoid the foreign particle or pierce the oxide layer. Further, in the assembly of such minute and delicate parts as those used in semiconductor devices, the necessary control and accuracy of assembly pressures is difficult to obtain by the mechanical movement of a jig to which a subassembly is affixed since the mass and kinetic energy of the movable jig must be overcome. For example, in the method described above, it is exceedingly difficult to obtain uniform contact pressure between the electrode and the crystal surface since at the instant that electrical contact is achieved the moving jig carrying the subassembly has a kinetic energy which tends to carry the subassembly past the point of initial contact. Thus, uniformity of manufacture and reliability of the manufactured semiconductor devices is difficult to achieve.

Accordingly, it is an object of the present invention to provide a method of, and apparatus for, joining an electrode to the surface of a semiconductor crystal in semiconductor devices.

It is another object of the present invention to provide a method of, and apparatus for, positioning a resilient electrode in electrical contact with the surface of a semiconductor body to provide reliable and reproducible electrical characteristics in semiconductor devices.

It is another object of the present invention to provide a method of, and apparatus for, joining a resilient electrode to the surface of a semiconductor crystal to provide a semiconductor translating device which affords a precision control of contact pressures between the electrode and crystal.

It is a further object of the present invention to provide a method of, and apparatus for, electrically connecting a resilient electrode to a semiconductor crystal to provide a semiconductor device which is readily adaptable to automation and multiple assembly.

It is still a further object of the present invention to provide a method of, and apparatus for, positively positioning a metallic resilient electrode in electrical point contact with the surface of a semiconductor crystal to provide a semiconductor device which is more efficient, more reliable, and less costly than apparatus heretofore known to the art.

The apparatus of the present invention, as adapted for joining the metallic electrode to the surface of the semiconductor crystal to provide an encapsulated semiconductor translating device, positively positions a first subassembly, which may be either the electrode subassembly or the semiconductor crystal subassembly, while utilizing a controlled and directed stream of cooled gas to move or support the mating second subassembly with respect to the first subassembly such that electrical contact at a predetermined pressure is obtained between the electrode and the surface of the semiconductor crystal. In order to achieve optimum results, an oscillating movement of small magnitude may be imparted to one of the subassemblies being joined. In the presently preferred embodiment of the device of the invention, which is adapted to the final sealing assembly of a glass encapsulated semiconductor device, means is provided for fusing the mating portions of the glass envelope by heating the semiconductor device after contact at a predetermined pressure is made between the metallic electrode and the surface of the semiconductor crystal.

The novel features which are believed to be characteristic of the invention, both as to its organization and method of operation, together with further objects and advantages thereof, will be better understood from the following description considered in connection with the accompanying drawings in which an embodiment of the invention is illustrated by way of example. It is to be expressly understood, however, that the drawings are for the purpose of illustration and description only, and are not intended as a definition of the limits of the invention.

Figure 3:
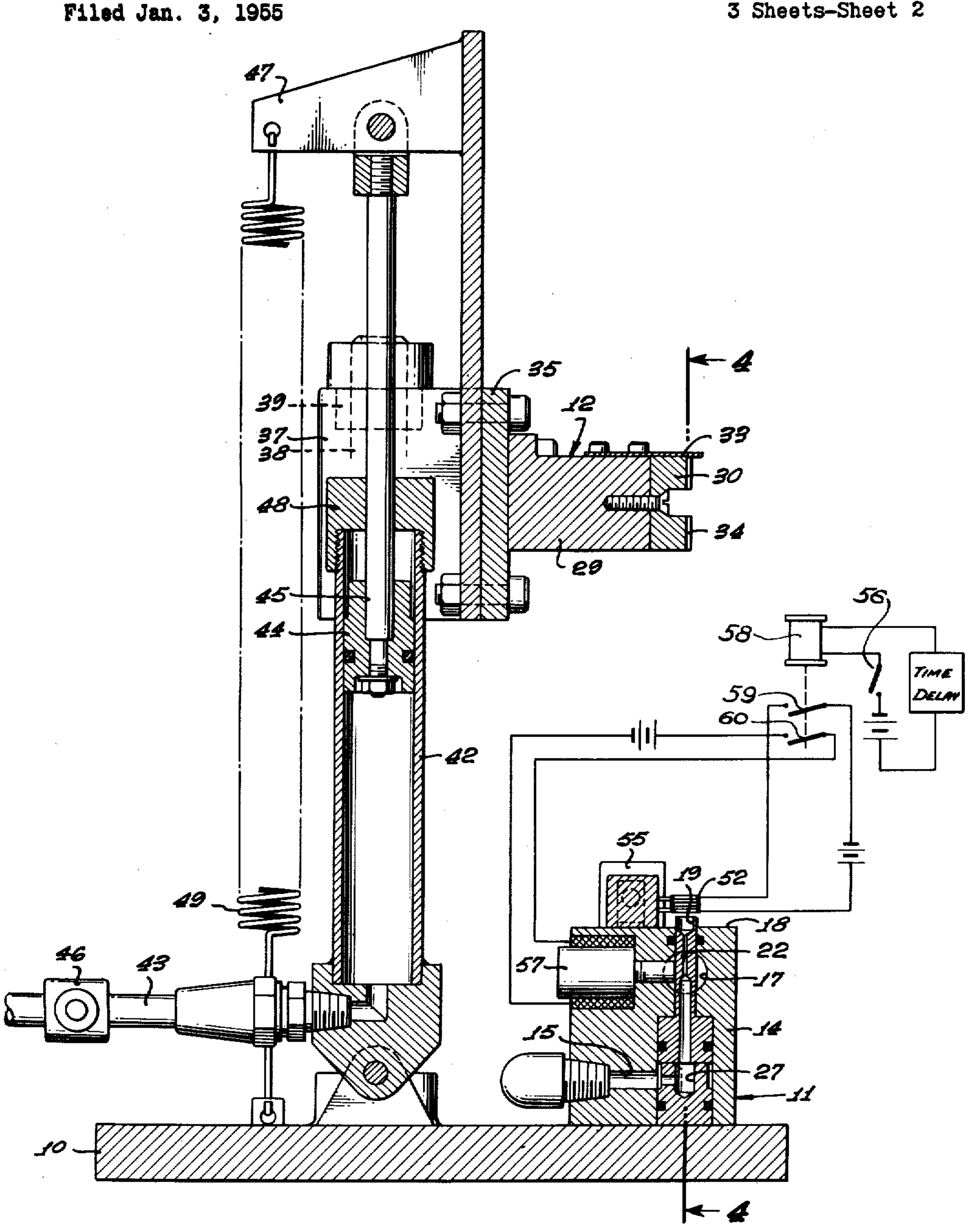
Fig. 3 is a sectional view in elevation taken along line 3—3 of Fig. 1.
Figure 4:
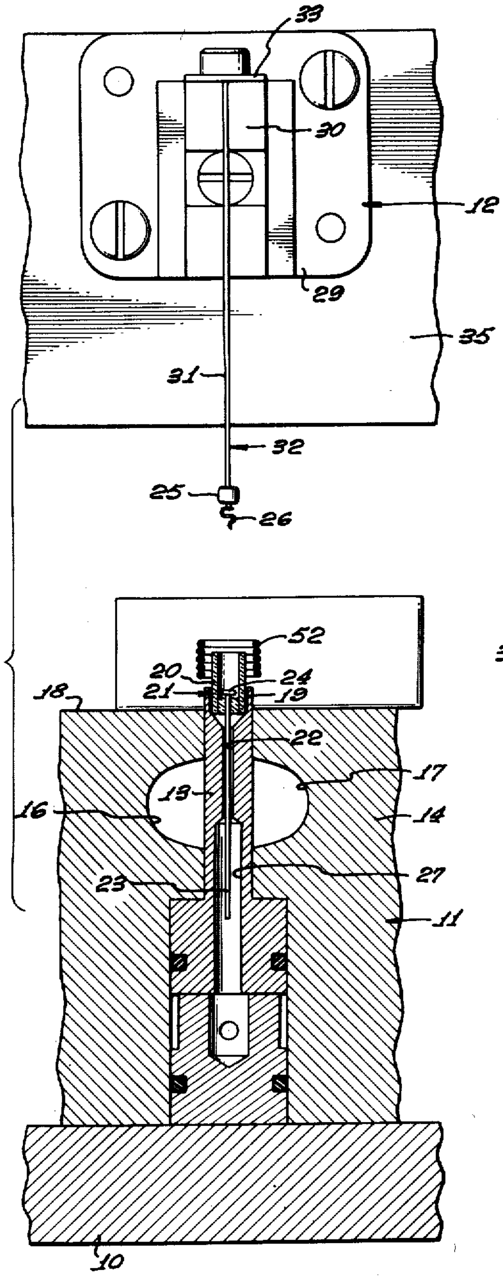
Fig. 4 is a partial sectional view taken along line 4—4 of Fig. 3 with the apparatus in the open, or non-operating, position and with the subassemblies of a representative semiconductor diode mounted in the apparatus prior to the assembly operation of the apparatus.
Figure 6:
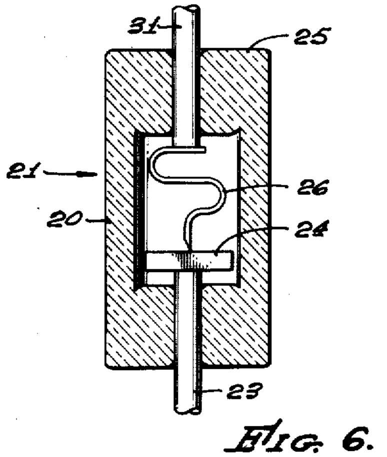
Figure 5:
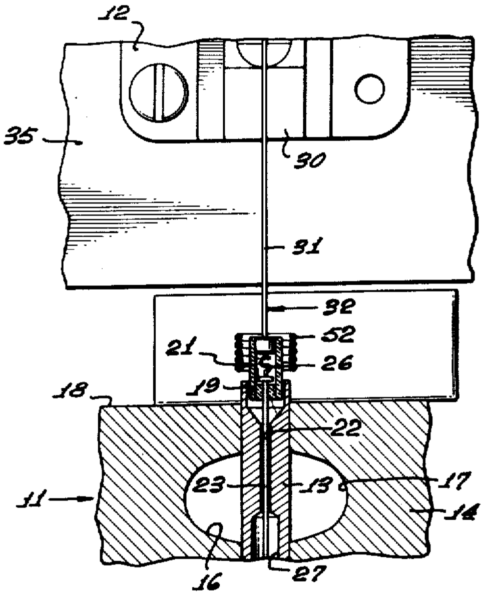

Fig. 5 is a partial sectional view taken along line 4—4 of Fig. 3 similar to Fig. 4 but with the apparatus in the closed, or operating, position in which the subassemblies of a semiconductor diode are shown in assembled position; and Fig. 6 is an enlarged cross sectional view of a representative semiconductor diode to be assembled by the apparatus of the present invention. The semiconductor diode forms no part of the present invention but is shown for purposes of clarity and explanation in the description of the apparatus.

Figure 1:
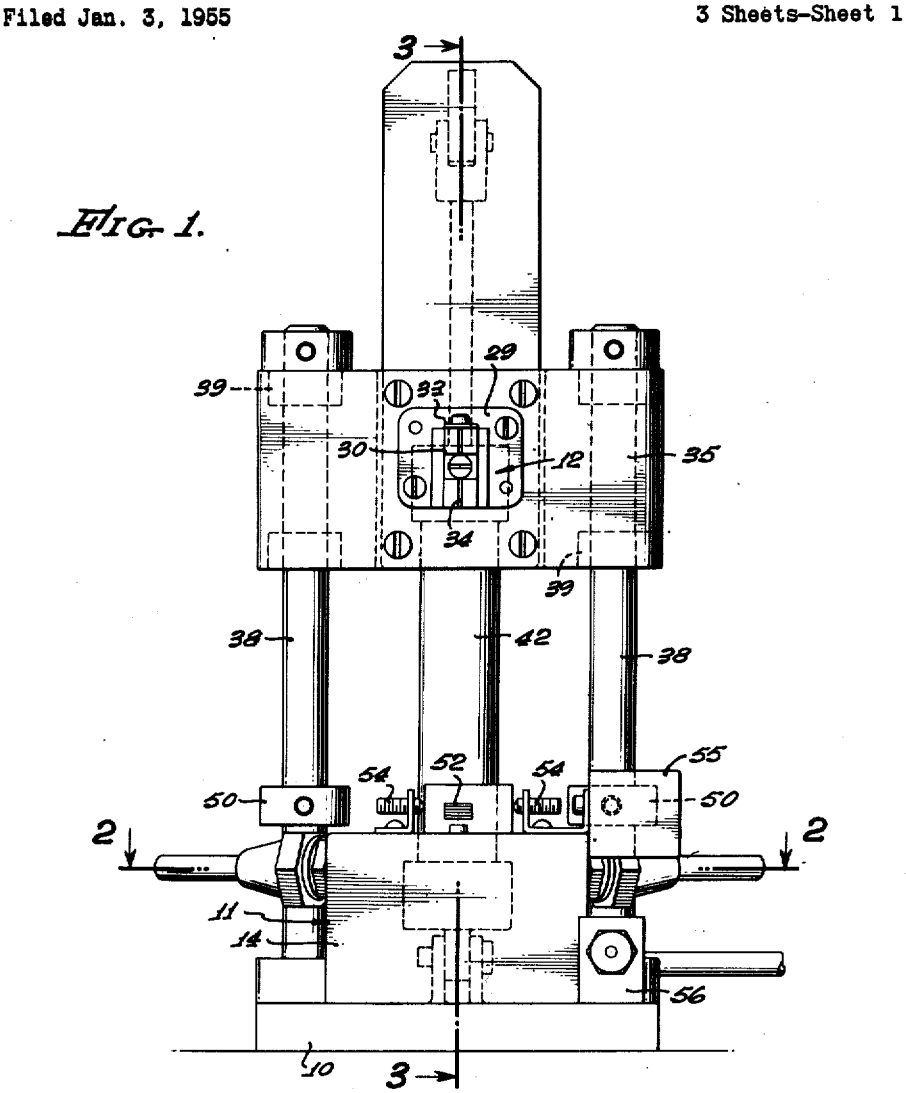
Fig. 1 is a front view in elevation of the apparatus of the present invention in its presently preferred form in the open, or non-operating, position.
Figure 2:
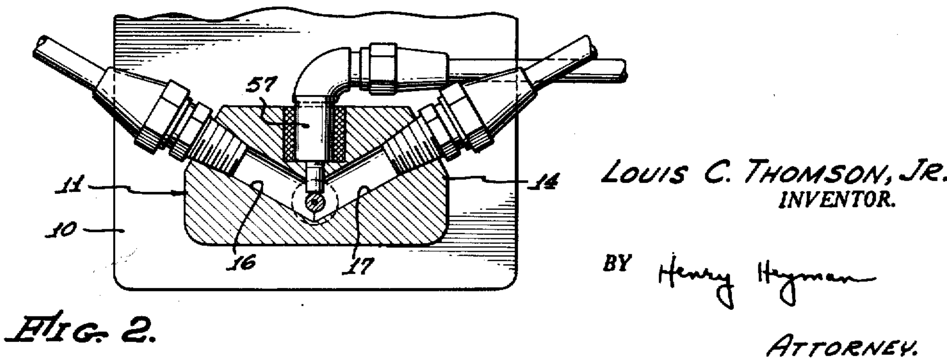
Fig. 2 is a partial sectional view taken along line 2—2 of Fig. 1.

Referring to the drawings, and particularly to Figs. 1 to 5, the device of the present invention comprises a base 10 upon which a lower work holding jig assembly 11 and the supporting structure for an upper work holding jig assembly 12 are mounted. A lower work holding jig 13, as more fully described hereinafter, is mounted within a lower jig assembly body 14 which, in the presently preferred embodiment, is a metallic body defining a vertical opening therethrough which has an internal configuration substantially equal to the external configuration of the lower work holding jig 13. The lower jig assembly body 14 defines an air inlet opening which, in the illustrated embodiment, is a horizontal air path or duct 15 positioned proximate the lower surface of the lower jig assembly body 14. A water inlet path 16 and water outlet path 17, referring to Fig. 2, are provided through the lower jig assembly body 14 and are located as more fully explained hereinafter.

A representative semiconductor diode of the type to be assembled by the apparatus of the present invention is shown in Fig. 6 and comprises a lead wire 23 to which a semiconductor crystal 24 is bonded and a glass tubular body 20 which is sealed to the lead wire proximate the semiconductor crystal 24 to form a semiconductor subassembly 21. An electrode 26 is connected to a lead wire 31, to which a glass bead 25 is affixed, proximate the end of the lead wire upon which the electrode is mounted, to form an electrode subassembly 32.

The lower jig 13, as adapted for the assembly of the representative semiconductor diode shown in Fig. 6, is symmetrical about a vertical axis and has an outer surface comprising two integral, longitudinally juxtaposed circular cylinders. In the presently preferred embodiment the outer surface of the lower work holding jig 13 is shaped in the described manner for ease of production and assembly; however, the outer configuration of the lower jig 13 is in no way critical to the present invention and, for the purposes of the present device, may be integral with the body 14. The vertical height of the lower jig 13 is substantially equal to, or greater than, the height of the lower jig assembly body 14 with the base of the lower jig 13 inserted flush with the lower surface of the body 14 and the upper end of the lower jig 13 flush with, or protruding above, the upper surface 18 of the body 14 by an amount determined by the semiconductor device being assembled.

The lower work holding jig 13 defines a female positioning cavity 19 which is cylindrical in shape, extending from the upper end of the lower jig 13 symmetrically downward along the vertical axis of the lower jig 13. A conical extension of the cylindrical cavity from the base of the cylinder is shown for ease of machining. The female positioning cavity 19 has an inside diameter substantially equal to, but greater than, the outside diameter of the glass tubular body 20 of the semiconductor subassembly of the semiconductor diode (Fig. 6), and has a depth at constant inside diameter equal to approximately one-half of the length of the glass tubular body 20. Connected to the female positioning cavity 19 is the orifice 22 which is cylindrical in configuration and symmetrical about the vertical axis of the lower jig 13, having a diameter substantially less than the diameter of the female positioning cavity 19 but greater than the outside diameter of the associated lead wire 23 of the semiconductor subassembly 21. The orifice 22 is approximately equal in length to the length of the lead wire 23. An air inlet path 27 defined by the lower work holding jig 13, connected to the orifice 22, extends downward to connect the orifice 22 with the air inlet path 15 through the lower jig assembly body 14. Thus, a continuous air path is provided through the lower jig assembly body 14 by way of the air inlet path 15 into the lower jig 13 by means of the air inlet path 27 and thence upward through air inlet path 27, orifice 22, and outward through the female positioning cavity 19.

The water inlet path 16 and the water outlet path 17, referring to Fig. 2, are so positioned through the lower jig assembly body 14 that water circulated therethrough is circulated past the lower jig 13 at the vertical position coincident with the orifice 22 to provide cooling of the air as it passes through the orifice 22. Therefore, a decided cooling effect of the semiconductor subassembly may be achieved by the air since it is cooled within the orifice 22 and then expanded into the female positioning cavity 19.

The upper jig assembly 12 comprises a mounting block 29 upon which an upper work holding jig 30 is mounted. The upper jig 30, in the illustrated embodiment, comprises a rectangular metallic body having a planar face and a vertical slot therein for positioning the lead wire 31 of the electrode subassembly 32 such that the axis of the electrode subassembly 32 is coincident with the extension of the vertical axis of the lower work holding jig 13. A positioning stop plate 33 is affixed to the upper surface of the mounting block 29 and extends a finite distance beyond the plane of the face of the upper jig 30. In the presently preferred embodiment, the upper jig 30 is permanently magnetized in order that the electrode subassembly 32 may be positioned in stationary engagement with the upper jig 30, although it will be apparent to those skilled in the art that clamps or other positive holding means may also be used. In the production of a representative semiconductor diode such as that shown in Fig. 6, the distance from the mating point of the electrode 26 to the opposed end of the associated lead wire 31 is accurately controlled. Thus, to properly position the electrode subassembly in the upper work holding jig 30, it is necessary only to insert the associated lead wire in the vertical slot 34 with the end of the lead wire abutting the adjoining horizontal face of the stop plate 33.

The mounting block 29 to which the upper work holding jig is affixed is in turn affixed to a bracket 35 which has normal extensions 37 proximate each end of the bracket 35. The extensions 37 are slidably affixed to guide shafts 38 by means of guide bearings 39 which are free to slide upon the guide shafts 38. The guide shafts 38 are in turn affixed to the base 10 with the axis of the shafts vertical. Thus, by means of the sliding engagement with the vertical shafts 38, the upper jig assembly 12 is constrained to move only in a vertical direction and the electrode subassembly 32 mounted in the upper work holding jig 30 is constrained to vertical movement coincident with the extension of the vertical axis of the lower work holding jig 13.

In order to raise and lower the upper jig assembly 12 an amount sufficient to insert the subassemblies of the semiconductor device, means are provided for raising the upper jig assembly a substantial distance above the lower jig. Although various means for so raising the upper jig assembly will be apparent to those skilled in the art, the presently preferred embodiment utilizes an air cylinder for this operation. To this end an air cylinder 42 is affixed to the base 10 having its vertical center line lying substantially in the vertical plane of the guide shafts 38. Air under pressure is admitted to the lower end of the air cylinder through an air pressure inlet 43. An air piston 44 slidable within the air cylinder 42 is affixed to a connecting rod 45 which is in turn affixed through a vertical bearing in the upper end 48 of the air cylinder 43 to a horizontal extension 47 of the bracket 35. The axis of the connecting rod 45 is coincident with the vertical center line of the air cylinder 42. Between the extension 47 and the base 10 a coil spring 49 is connected such that when the upper jig assembly is raised by admitting air under pressure to the air cylinder 43 a slight spring force is exerted downward on the extension 47 against the air pressure within the cylinder. An exhaust valve 46 is inserted in the air pressure line to the air cylinder 42 to release the air under pressure within the air cylinder when the upper jig assembly 12 is to be lowered.

It may be readily seen that as the air is exhausted from the air cylinder 42 the upper jig assembly will move downward along the guide shafts 38 by the force of gravity alone; however, the spring 49 is used in the present embodiment in order to obtain a positive downward movement by exhausting the air from the air cylinder with a force in addition to the force of gravity. Positioning stops 50 are mounted on the guide shafts 38 to properly position the lower jig assembly in its closed, or operating, location. The positioning stops 50 are adjustable in height and are adjusted to the position which will bring the electrode subassembly downward to its mating position with the semiconductor subassembly as described hereinafter.

A resistance heating coil 52 is positioned symmetrically about the extension of the vertical axis of the lower jig 13 at a distance above the female positioning cavity 19 of the lower work holding jig 13. In the embodiment shown, the heating means (Fig. 1) is mounted upon the upper surface of the body 14 by means of adjustable positioning clamps 54 which may be used to alter the position of the heating coil 52 with respect to the vertical axis of the lower jig 13.

A vibratory means, such as a motor vibrator 55, is affixed to a vertical surface of the lower jig assembly body 14 in the presently preferred embodiment, although it may be found to be more expedient to affix it in certain applications to the upper jig. When operated, the motor vibrator imparts an oscillating rectilinear motion of small magnitude to the lower jig assembly body for the purposes discussed hereinafter in connection with the operation of the present device.

A solenoid switch 56 is mounted upon the base 1. The solenoid switch, together with associated circuitry, operates the inductive heating means after pressure contact is established between the metallic electrode and the semiconductor surface.

An electromagnet 57 is positioned within the lower jig assembly body 14 proximate the outer surface of the lower work holding jig 13 adjacent the lower jig 13 at a position below the lower end of the female positioning cavity 19. Appropriate electrical circuitry is connected to the electromagnet 57 to energize the magnet at substantially the same time that the heating coil 52 is energized. Thus, in the operation of the apparatus as described hereinafter, as the semiconductor subassembly 21 is raised into pressure contact with the electrode subassembly 32 the solenoid switch 56, shown diagrammatically in Fig. 3, is closed. After a predetermined time delay, for example, three seconds, to allow pressure contact between the subassemblies, a relay 58 is energized and closes switches 59, 60 to energize the heating coil 52 and electromagnet 57.

Thus, referring particularly to Figs. 3, 4, and 5, in the operation of the apparatus in its presently preferred embodiment as adapted for the final assembly of the representative semiconductor diode shown in Fig. 6, air is admitted into the air cylinder 42 by means of the valve 46 and the upper jig assembly 12 is raised to, and maintained in, the open position, as illustrated in Figs. 3 and 4. The electrode subassembly 32 of the semiconductor diode is then positioned in the aligning slot 34 along the face of the upper work holding jig 30 with the end of the associated lead wire, opposed to the end upon which the glass bead 25 and metallic electrode 26 are mounted, abutting the horizontal stop plate 33. The semiconductor subassembly 21 of the semiconductor diode is inserted in the lower work holding jig 13 with the associated lead wire 23 extending into the orifice 22 while the glass tubular body 20 is positioned in the female positioning cavity 19. As an illustration, the diameter of the orifice in the presently preferred embodiment is equal to 0.022 inch for the representative diode shown, in which the associated lead wires have a diameter of 0.020 inch. Air pressure is now released from the air cylinder and the upper jig assembly 12 descends along the vertical path to which it is constrained by the guide bearings 39 sliding downward on the guide shafts 38. Cooling water is admitted through the water inlet path 16, circulated around the exterior of the lower jig 13, and passed from the lower jig assembly body 14 through the water outlet path 17. With the upper work holding jig 13 holding electrode subassembly 32 in the lowererd position, the electrode 26 extends within the glass tubular body 20 of the semiconductor subassembly 21 but is a finite distance from the upper surface of the semiconductor crystal 24. In a typical operation the electrode is stopped at the position in which its contact point is approximately 0.020″ above the surface of the crystal 24. Thus, to effect the final assembly steps, it is necessary to raise the semiconductor subassembly 21 approximately 0.020" to cause contact at a predetermined pressure between the electrode and the surface of the semiconductor crystal. The motor vibrator 55 is started and an oscillating movement normal to the vertical axis of the lower work holding jig 13 and the positioned subassemblies is begun. In the presently preferred embodiment a standard 60-cycle motor vibrator of a type well known to the art is used to impart a rectilinear movement of the magnitude of a few mils. The oscillating movement, which in this embodiment is normal to the direction in which the semiconductor subassembly is to be raised, is performed for two purposes: first, by imparting the small initial movement to the semiconductor subassembly, it is less difficult to overcome the initial frictional forces of the subassembly. This allows finer control of the vertical movement of the subassembly inasmuch as the necessity to produce a greater force to initially move the subassembly than that which is required to raise it is minimized. Secondly, as the semiconductor is raised into contact with the metallic electrode, a small rectilinear movement allows the electrode to more readily pierce any oxide film which may be present on the surface of the semiconductor and allows the electrode to avoid any small particles of foreign matter which may be present. Although a movement in the direction normal to the axes of the subassemblies is used in this embodiment, it has been found that the direction of movement is not critical since the movement is of very small magnitude.

After the horizontal vibratory movement has been begun, air is admitted into the air inlet path 15 of the lower jig assembly body 14 under accurately controlled and predetermined pressure. The air then passes through the lower jig assembly body 14 into the air inlet path 27 of the lower work holding jig 13 and upward through the orifice 22. The semiconductor subassembly 21 is raised by the action of the upwardly directed, controlled stream of air exerting pressure on the glass tubular body 20 and the associated lead wire 23. As presently preferred, the pressure of air at the orifice outlet which is used to raise the semiconductor subassembly is in the range of 0.5 to 2.0 pounds per square inch for the assembly of semiconductor devices in which the electrode is gold, and approximately 10 pounds per square inch when molybdenum electrodes are used. The exact pressure to be used may be readily determined by one skilled in the art, since the pressure required is dependent upon the weight of the subassembly being moved and the contact pressure which is desired between the electrode and crystal surface.

As the semiconductor subassembly is raised, the surface of the semiconductor 24 makes pressure contact with the electrode 26. At this point electrical continuity is achieved at a closely controlled and predetermined contact pressure. After pressure contact has been established between the electrode and the semiconductor crystal the heating coil is energized by an associated time delay circuit of the type well known to the art and intense heat is produced surrounding the glass tube 20 and the glass bead 25 which is affixed to the associated lead wire of the electrode subassembly which is now within the confines of the glass tube. The heating coil is so positioned along the axes of the subassemblies that heat is concentrated at the circumferential surface of the glass tubular body where fusion with the glass bead is desired. The glass bead and the glass tubular body are thus fused and coalesced to form a hermetically sealed glass encapsulating envelope about the metallic electrode and semiconductor crystal which are maintained in contact at the predetermined pressure. Simultaneous with the energizing of the heating coil, the electromagnet is also energized. The electromagnet is of sufficient strength to exert a sidewise force upon the associated lead wire to pull it toward the surface of the orifice at which the electromagnet is positioned. A drag effect is thereby created which produces a vertical stabilizing effect on the semiconductor subassembly. Thus, the magnet in effect supersedes the vertical force of the air stream directed upon the semiconductor subassembly but, on the other hand, does not positively lock the semiconductor subassembly in the vertical position which it occupies at the time the electromagnet is energized. Therefore, any contracting or expanding forces exerted on the glass tubular body are compensated without allowing an alteration in the pressure contact between the electrode and the semiconductor surface.

The temperature utilized in the heating coil in order to fuse the encapsulating envelope is of the order of 1400° C., while temperatures in excess of 90° C. may adversely affect the electrical characteristics of a germanium crystal. The stream of air, after being cooled in the orifice 22 by the water being circulated past the orifice and expanded in the female positioning cavity 19 has a low temperature and accordingly serves an important function after its lifting force has been superseded by the electromagnet. The cooled stream of air impinges upon the glass tube 20 in the area surrounding the semiconductor crystal 24 and thus maintains the semiconductor crystal at a low temperature while the upper portion of the glass tube and the glass bead 25 are raised to a high temperature and fused by the heating coil 52.

The semiconductor device is now sealed as shown in Fig. 6 and encapsulated with proper electrical contact between the crystal and the metallic electrode. The final processing may be completed while the diode remains in the apparatus of the present invention by passing a surge current through the diode to weld the metallic electrode to the semiconductor crystal and thereby achieve a miniature fused junction between the metallic electrode and the semiconductor crystal. The assembly and processing procedure is then complete and the apparatus is returned to its open position by again admitting air under pressure into the air cylinder to raise the upper jig away from the lower jig. The completed semiconductor device is then removed from the upper jig and the apparatus is ready for the insertion of the subassemblies of the next semiconductor diode to be assembled.

As an alternative method of assembling a semiconductor diode by means of the aparatus shown and described herein, it has been found that under some production conditions it is expedient to vary the steps described herein in conjunction with the operation of the apparatus. In accordance with such an alternative method the subassembly which is supported on the cooled stream of gas is moved and then the positively positioned subassembly is brought into pressure contact. Thus, referring again to Figs. 4 and 5, the stream of cooled air is continuously admitted under accurately controlled pressure into the female positioning cavity 19, and the motor vibrator is operated continuously. The lead wire 23 of the semiconductor subassembly is placed in the orifice 22, and the subassembly is immediately floated and supported by the stream of air. The electrode subassembly 32 is then placed in the upper work holding jig 30 and lowered, as described hereinbefore, through the same distance and to the same position as that described in conjunction with the hereinbefore described method of operation. Thus, as the electrode subassembly is lowered, the point of the electrode comes into contact with the surface of the semiconductor crystal and depresses the semiconductor subassembly to obtain the predetermined contact pressure. The heating coil and the electromagnet are then energized and the semiconductor encapsulating envelope is sealed.

Although the foregoing description of the method and apparatus of the present invention has been made with reference to the presently preferred embodiment in which the subassemblies are aligned in a vertical axis, the method and apparatus are also satisfactory if the axis of alignment and assembly are horizontal or at any angle between the horizontal and vertical. Thus, it may be convenient for the ease of the operator of the apparatus to incline the apparatus to an angle of 45°, for example.

It may readily be seen that the method and apparatus described herein lends itself to complete automation in the assembly of semiconductor translating devices of the type having a metallic electrode in contact with the surface of a semiconductor crystal.

Thus, what has been described herein is a method and apparatus for electrically connecting a metallic electrode and a semiconductor crystal disposed in an encapsulating envelope to provide a semiconductor device which allows precision control of the contact pressure between the electrode and the semiconductor crystal to provide electrical characteristics of the semiconductor device which are more reliable and uniform than those of semiconductor devices produced by methods and apparatus heretofore known to the art.

What is claimed is:

1. An apparatus for joining an electrode subassembly and a semiconductor crystal subassembly to provide an encapsulated semiconductor device, the electrode subassembly comprising a metalic electrode affixed to an end of an associated lead wire and the semiconductor crystal subassembly comprising a semiconductor crystal mounted upon an end of another associated lead wire within an envelope housing, said apparatus comprising: means for axially aligning said subassemblies so that the end of said electrode is opposed to the surface of said semiconductor crystal; means for positioning a first of said subassemblies with respect to the second of said subassemblies; means providing a controlled and directed stream of air to support said second subassembly in electrical contact with said crystal at a predetermined pressure between said electrode and said surface of said semiconductor crystal; and means for encapsulating within said envelope said electrode and said semiconductor crystal after initial pressure contact is achieved, thereby fixing said electrode and said semiconductor crystal in electrical contact at said predetermined pressure.

2. An apparatus for joining an electrode subassembly and a semiconductor crystal subassembly to provide an encapsulated semiconductor device, the electrode subassembly comprising a metallic electrode affixed to an end of an associated lead wire and the semiconductor crystal subassembly comprising a semiconductor crystal mounted upon an end of another associated lead wire within an envelope housing, said apparatus comprising: means for axially aligning said subassemblies in a manner such that the end of said electrode is opposed to a surface of said semiconductor crystal; means for positioning a first of said subassemblies at a finite distance from the second subassembly; means for moving said second subassembly through said finite distance and supporting said second subassembly in electrical contact with and at a predetermined pressure between said electrode and said surface of said semiconductor crystal by a controlled and directed stream of air; and means for encapsulating within said envelope said electrode and said semiconductor crystal, thereby fixing said electrode and said semiconductor crystal in electrical contact at said predetermined pressure after initial electrical contact is achieved.

3. An apparatus for joining an electrode subassembly and a semiconductor crystal subassembly to provide an encapsulated semiconductor device, the electrode subassembly comprising a metallic electrode affixed to an end of an associated lead wire and the semiconductor crystal subassembly comprising a semiconductor crystal mounted upon an end of another associated lead wire within an envelope housing, said apparatus comprising: means for axially aligning said subassemblies so that the end of said electrode is opposed to the surface of said semiconductor crystal; means for supporting a first subassembly on a controlled and directed stream of air; means for positioning the second subassembly in electrical contact at a predetermined pressure between said electrode and said surface of said semiconductor crystal, said pressure being determined by the air pressure exerted on said first subassembly; and means for encapsulating within said envelope said electrode and said semiconductor crystal, thereby fixing said electrode and said semiconductor crystal in electrical contact at a predetermined pressure after initial electrical contact is achieved.

4. An apparatus for joining an electrode subassembly and a semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said apparatus comprising: means for axially aligning said subassemblies, the end of said electrode being opposed to a surface of said semiconductor crystal; means for positioning a first subassembly with respect to the second subassembly; means providing a controlled and directed stream of air to support said second subassembly in electrical contact with said first subassembly at a predetermined contact pressure between said electrode and said surface of said semiconductor crystal; and means for fusing said glass bead and said glass tubular body, thereby encapsulating said electrode and said semiconductor crystal to fix said electrode and said semiconductor crystal in electrical contact at a predetermined pressure.

5. An apparatus for joining an electrode subassembly and a semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, the glass body surrounding and extending beyond the semiconductor crystal, said apparatus comprising: means for axially aligning said subassemblies so that the end of said electrode is opposed to a surface of said semiconductor crystal; means for positioning a first of said subassemblies at a finite distance from the second subassembly; means providing a controlled and directed stream of air to move said second subassembly through said finite distance and to support said second subassembly upon the controlled and directed stream of air in electrical contact with said first subassembly and at a predetermined pressure between said electrode and said surface of said semiconductor crystal; and means for fusing said glass bead and said glass tubular body after initial electrical contact is achieved, thereby encapsulating said electrode and said semiconductor crystal and fixing said electrode and said semiconductor crystal in electrical contact at said predetermined pressure.

6. An apparatus for joining an electrode subassembly and a semiconductor crystal subassembly to provide a glass encapsulated semiconducting device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said apparatus comprising:

means for axially aligning said subassemblies so that the end of said electrode is opposed to a surface of said semiconductor crystal; means providing a controlled and directed stream of air to support a first subassembly; means for positioning the second subassembly in electrical contact with said first subassembly at a predetermined contact pressure between said electrode and said surface of said semiconductor crystal, said pressure being determined by the air pressure exerted on said first subassembly; means for imparting an oscillating rectilinear movement to one of said subassemblies, and means for fusing said glass bead and said glass tubular body after initial electrical contact is achieved, thereby encapsulating said electrode and said semiconductor crystal and fixing said electrode and said semiconductor crystal in electrical contact at a predetermined pressure.

7. An apparatus for joining an electrode subassembly and a semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said apparatus comprising: a first and second work-holding jig, said first work holding jig being a stationary jig, said second work holding jig being movable with respect to said first work holding jig, means for positioning said second work holding jig at a predetermined distance from a surface of said first work holding jig; said first work holding jig defining a cylindrical female positioning cavity extending from said surface of said first work holding jig to a depth substantially less than the length of the glass tubular body of said semiconductor crystal subassembly and having an inside diameter substantially equal to, but greater than the outside diameter of said glass tubular body, said first work holding jig defining a cylindrical orifice connected to, and extending from, the base of said female positioning cavity symmetrically along the axis of said female positioning cavity, said orifice having an inside diameter substantially equal to, but greater than, the outside diameter of the lead wire of said semiconductor crystal subassembly, said first work holding jig defining an air inlet path to said orifice; a source of controlled air pressure to said air inlet path; said second work holding jig having a means for positively engaging the electrode subassembly of said semiconductor device in said jig on the extension of the axis of said female positioning cavity of said first work holding jig, means for moving said second work holding jig parallel to said axis; and a heating coil having an inside diameter greater than the outside diameter of said glass tubular body, said heating coil being positioned above said surface of said first work holding jig within said predetermined distance between the surface of said first work holding jig and said second work holding jig, said heating coil being substantially symmetrical about the extension of said axis of said female positioning cavity.

8. The combination according to claim 7 further provided with means for imparting an oscillating rectilinear movement to one of said work holding jigs of said apparatus.

9. An apparatus for joining an electrode subassembly and the semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said apparatus comprising: a first and second work holding jig, said first work holding jig being stationary and disposed symmetrically about the vertical axis thereof, said second work holding jig being movable with respect to said first work holding jig, means for positioning said second work holding jig at a predetermined finite distance above the upper surface of said first work holding jig; said first work holding jig defining a cylindrical female positioning cavity, said positioning cavity being symmetrical about said vertical axis and extending from said upper surface of said first work holding jig to a depth substantially equal to one-half the length of the glass tubular body of said semiconductor crystal subassembly and having an inside diameter substantially equal to, but greater than, the outside diameter of said glass tubular body, said first work holding jig defining a cylindrical orifice co-extensive with, and extending from, the lower end of said positioning cavity, said orifice being symmetrical about said vertical axis of said positioning cavity, said orifice having an inside diameter substantially equal to, but greater than, the outside diameter of the lead wire of said semiconductor crystal subassembly, said orifice having a length approximately equal to the length of said lead wire, said first work holding jig defining an air inlet path to said orifice; a source of controlled air pressure to said air inlet path; said second work holding jig having means for positively engaging the lead wire of the electrode subassembly of said semiconductor device in said jig symmetrically about the vertical axis of said positioning cavity of said first work holding jig, means for raising said second work holding jig parallel to said vertical axis; a heating coil having an inside diameter greater than the outside diameter of said glass tubular body, said heating coil being positioned above said upper surface of said first work holding jig proximate said upper surface, said heating coil being substantially symmetrical about said vertical axis of said positioning cavity; and a motor vibrator affixed to one of said work holding jigs to impart an oscillating horizontal movement to said work holding jig.

10. A method for joining an electrode subassembly and a semiconductor crystal subassembly to provide a glass encapsulated semiconductor translating device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said method comprising the steps of: axially aligning the subassemblies with the end of the electrode disposed opposed to a surface of the semiconductor crystal; positively positioning a first subassembly with respect to the second subassembly; providing a controlled and directed stream of air to support the second subassembly in contact with said first subassembly to provide electrical contact between the electrode and the surface of the semiconductor crystal; and fusing the glass bead and the glass tubular body, thereby encapsulating the electrode and the semiconductor crystal while maintaining the electrode and the semiconductor crystal in electrical contact.

11. A method for joining an electrode subassembly and a semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of another associated lead wire and having a glass tubular encapsulating body affixed to the lead wire proximate the semiconductor crystal, surrounding and extending beyond the semiconductor crystal, said method comprising the steps of: axially aligning the subassemblies with the end of the electrode disposed opposed to a surface of the semiconductor crystal; positively positioning a first subassembly at a finite distance from the second subassembly; providing a controlled and directed stream of air to move the second subassembly through said finite distance and support the second subassembly upon said controlled and directed stream of air in contact with the first subassembly to provide electrical contact between the electrode and the surface of the semiconductor crystal; and fusing the glass bead on the glass tubular body after initial electrical contact is achieved, thereby encapsulating the electrode and the semiconductor crystal while maintaining the electrode and the semiconductor crystal in electrical contact with each other.

12. A method for joining an electrode subassembly and a semiconductor crystal subassembly to provide a glass encapsulated semiconductor device, the electrode subassembly comprising a resilient metallic electrode affixed to an end of an associated lead wire and having a glass bead affixed to the lead wire proximate the metallic electrode, and the semiconductor crystal subassembly comprising a semiconductor crystal mounted upon an end of its associated lead wire and having a glass tubular encapsulating body affixed to the lead wire proximate the semiconductor crystal, surrounding and extending beyond the semiconductor crystal, said method comprising the steps of: axially aligning the subassemblies with the end of the electrode disposed opposed to a surface of the semiconductor crystal; providing a controlled and directed stream of air to support a first subassembly; positively positioning the second subassembly in contact with said first subassembly to provide electrical contact between the electrode and the surface of the semiconductor crystal, said electrical contact being determined by the air pressure exerted on the first subassembly; imparting an oscillating rectilinear movement to one of said subassemblies; and fusing the glass bead and the glass tubular body after initial electrical contact is achieved, thereby encapsulating the electrode and the semiconductor crystal while maintaining the electrode and the semiconductor crystal in electrical contact with each other.

References Cited in the file of this patent

UNITED STATES PATENTS

| | | |
|---|---|---|
| 2,575,746 | Cartun | Nov. 20, 1951 |
| 2,694,168 | North et al. | Nov. 9, 1954 |

UNITED STATES PATENT OFFICE

CERTIFICATE OF CORRECTION

Patent No. 2,815,608

December 10, 1957

Louis Charles Thomson, Jr.

It is hereby certified that error appears in the printed specification of the above numbered patent requiring correction and that the said Letters Patent should read as corrected below.

Column 10, line 66, claim 6, for "semiconducting" read --semiconductor--.

Signed and sealed this 18th day of February 1958.

(SEAL)
Attest:
KARL H. AXLINE
Attesting Officer

ROBERT C. WATSON
Commissioner of Patents